United States Patent
Ito et al.

(10) Patent No.: US 10,724,810 B1
(45) Date of Patent: Jul. 28, 2020

(54) HEAT CONDUCTIVE SHEET

(71) Applicant: ZEON CORPORATION, Chiyoda-ku, Tokyo (JP)

(72) Inventors: Toyokazu Ito, Tokyo (JP); Hiromi Kitagawa, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 16/419,027

(22) Filed: May 22, 2019

(51) Int. Cl.
  *B32B 7/12* (2006.01)
  *F28F 21/02* (2006.01)
  *F28F 21/06* (2006.01)
  *H05K 7/20* (2006.01)

(52) U.S. Cl.
  CPC ............ *F28F 21/02* (2013.01); *F28F 21/06* (2013.01); *H05K 7/2039* (2013.01); *F28F 2260/00* (2013.01)

(58) Field of Classification Search
  CPC .................................. B32B 7/02; B32B 7/12
  See application file for complete search history.

(56) References Cited

U.S. PATENT DOCUMENTS

| | | |
|---|---|---|
| 2008/0318049 A1 | 12/2008 | Hata et al. |
| 2018/0194122 A1* | 7/2018 | Kumamoto ............. H05K 7/20 |
| 2019/0048244 A1 | 2/2019 | Ito et al. |

FOREIGN PATENT DOCUMENTS

| | | |
|---|---|---|
| WO | 2006011655 A1 | 2/2006 |
| WO | 2017145954 A1 | 8/2017 |

* cited by examiner

*Primary Examiner* — Lawrence D Ferguson
(74) *Attorney, Agent, or Firm* — Kenja IP Law PC

(57) ABSTRACT

Disclosed is a heat conductive sheet which comprises a flame retardant resin and a particulate carbon material, wherein the particulate carbon material has a particle size distribution in which a frequency of particles having a particle diameter of 30 μm or more and 150 μm or less is 20% or more, an amount of the particulate carbon material in the heat conductive sheet is 30% by mass or more, and a thickness of the heat conductive sheet is 50 μm or more and 120 μm or less. Preferably, the flame retardant resin is a combination of a flame retardant resin that is solid at ordinary temperature and ordinary pressure and a flame retardant resin that is liquid at ordinary temperature and ordinary pressure.

5 Claims, 1 Drawing Sheet

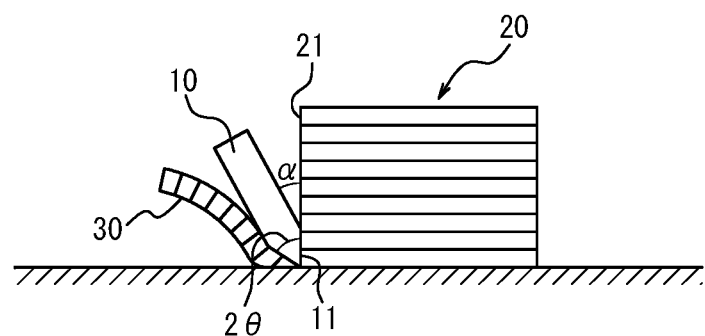

HEAT CONDUCTIVE SHEET

TECHNICAL FIELD

The present disclosure relates to heat conductive sheets.

BACKGROUND

In recent years, electronic parts such as plasma display panels (PDPs) and integrated circuit (IC) chips generate more heat along with their increasing performance. This has led to the necessity of taking measures to prevent function failure due to temperature rises in the electronic parts of electronic devices.

General measures to prevent function failure due to temperature rise involve attaching a heat radiator such as a metallic heat sink, radiation plate or radiation fin to a heat source such as an electronic part to facilitate heat dissipation. When a heat radiator is used, the heat radiator and the heat source are closely attached to each other via a sheet member having high heat conductivity (heat conductive sheet) in order to efficiently transfer heat from the heat source to the heat radiator.

Hence, heat conductive sheets sandwiched between a heat source and a heat radiator during use are required to have high heat conductivity.

To that end, for example, PTL 1 proposes a high heat conductive sheet formed by the steps of: shaping a composition containing a fluororesin that is solid at ordinary temperature, a fluororesin that is liquid at ordinary temperature and expanded graphite into a sheet by pressure application to provide a pre-heat conductive sheet; obtaining a laminate either by laminating a plurality of such preheat conductive sheets in the thickness direction or by folding or rolling such a pre-heat conductive sheet; and slicing the laminate at an angle of 45° or less relative to the lamination direction to provide a heat conductive sheet. The heat conductive sheet disclosed in PTL 1 includes strips containing fluroresins and expanded graphite (slices of the pre-heat conductive sheet(s) that constituted the laminate) joined together in parallel, with each strip containing a fluororesin that is solid at ordinary temperature, a fluororesin that is liquid at ordinary temperature, and expanded graphite. With such a configuration, the heat conductive sheet adheres well to a heat source and a heat radiator and hence can exhibit high heat conductivity.

CITATION LIST

Patent Literature

PTL 1: WO2017/145954A1

SUMMARY

Technical Problem

Heat conductive sheets have also been required to have high flame retardancy from the viewpoint of safety.

However, the heat conductive sheet of the prior art described above has room for further improvements in achieving excellent flame retardancy and excellent heat conductivity at the same time.

An object of the present disclosure is therefore to provide a heat conductive sheet which may have excellent flame retardancy and excellent heat conductivity at the same time.

Solution to Problem

The inventors made extensive studies to achieve the foregoing object and established that when a heat conductive sheet comprises a flame retardant resin and a particulate carbon material having a specific particle size distribution and the amount of the particulate carbon material and the thickness of the heat conductive sheet fall within respective specific ranges, excellent flame retardancy and excellent heat conductivity may be achieved at the same time. The present disclosure was completed based on this discovery.

Specifically, the present disclosure aims to advantageously solve the foregoing problem and a heat conductive sheet of the present disclosure is a heat conductive sheet which comprises a flame retardant resin and a particulate carbon material, wherein the particulate carbon material has a particle size distribution in which a frequency of particles having a particle diameter of 30 µm or more and 150 µm or less is 20% or more, an amount of the particulate carbon material in the heat conductive sheet is 30% by mass or more, and a thickness of the heat conductive sheet is 50 µm or more and 120 µm or less. With such a heat conductive sheet which comprises a flame retardant resin and a particulate carbon material having a specific particle size distribution and which has a thickness and an amount of the particulate carbon material that fall within respective specific ranges, it is possible to achieve excellent flame retardancy and excellent heat conductivity at the same time.

The particle size distribution of the particulate carbon material refers to a volume-based particle size distribution measured by laser diffraction. The particle size distribution of the particulate carbon material can be measured for a particulate carbon material which has been taken out from the heat conductive sheet by any methods, e.g., by dissolving the resin contained in the heat conductive sheet using a good solvent for the resin. The thickness of the heat conductive sheet can be measured by the methods described in Examples demonstrated herein.

In the heat conductive sheet of the present disclosure, it is preferred that the flame retardant resin is a combination of a flame retardant resin that is solid at ordinary temperature and ordinary pressure and a flame retardant resin that is liquid at ordinary temperature and ordinary pressure. When the flame retardant resin is a combination of a flame retardant resin that is solid at ordinary temperature and ordinary pressure and a flame retardant resin that is liquid at ordinary temperature and ordinary pressure, it is possible to improve the handleability of the heat conductive sheet by improving the balance between hardness and tackiness of the heat conductive sheet, as well as to reduce the interfacial thermal resistance during use by increasing the interfacial adhesion.

"Ordinary temperature" as used herein refers to a temperature of 23° C. and "ordinary pressure" as used herein refers to a pressure of 1 atm (absolute pressure).

In the heat conductive sheet of the present disclosure, it is preferred that the flame retardant resin is a fluororesin or a silicone resin. When the flame retardant resin is a fluororesin or a silicone resin, it is possible to further increase the flame retardancy of the heat conductive sheet.

In the heat conductive sheet of the present disclosure, it is preferred that the particulate carbon material is expanded graphite. When the particulate carbon material is expanded graphite, it is possible to further increase the heat conductivity of the heat conductive sheet.

In the heat conductive sheet of the present disclosure, it is preferred that the volume-average particle diameter of the particulate carbon material is 20 µm or more and 180 µm or less. When the volume-average particle diameter of the particulate carbon material is 20 μm or more and 180 μm or less, it is possible to further favorably achieve excellent flame retardancy and excellent heat conductivity at the same time.

"Volume-average particle diameter" as used herein refers to the particle size (D50) at which the cumulative volume calculated from the fine side in a particle size distribution (volume basis) as measured by laser diffraction becomes 50%. The volume-average particle diameter of the particulate carbon material can be measured for a particulate carbon material which has been taken out from the heat conductive sheet by any methods, e.g., by dissolving the resin contained in the heat conductive sheet using a good solvent for the resin.

Advantageous Effect

According to the present disclosure, it is possible to provide a heat conductive sheet which may have excellent flame retardancy and excellent heat conductivity at the same time.

BRIEF DESCRIPTION OF THE DRAWINGS

In the accompanying drawing:
The Figure is an illustration for explaining a step when producing a heat conductive sheet according to the present disclosure.

DETAILED DESCRIPTION

Embodiments of the present disclosure will be described in detail below.

(Heat Conductive Sheet)

The heat conductive sheet of the present disclosure comprises a flame retardant resin and a particulate carbon material, and optionally may further comprise additives. The particulate carbon material has a particle size distribution in which the frequency of particles having a particle diameter of 30 μm or more and 150 μm or less is 20% or more. The amount of the particulate carbon material in the heat conductive sheet is 30% by mass or more. The thickness of the heat conductive sheet is 50 μm or more and 120 μm or less. Because the heat conductive sheet of the present disclosure comprises a flame retardant resin and a particulate carbon material which has the specific particle size distribution described above and have an amount of the particulate carbon material and a thickness that fall within the respective specific ranges described above, it is possible to achieve excellent flame retardancy and excellent heat conductivity at the same time. Thus, when the heat conductive sheet of the present disclosure is used in combination with a heat sink, a radiation plate, radiation fin or other heat radiators, it is possible to allow heat to effectively diffuse from the heat source via the heat conductive sheet. Also, because of its excellent flame retardancy, the heat conductive sheet of the present disclosure can be safely used even when it is brought in contact with a heat source.

<Flame Retardant Resin>

Flame retardant resins included in the heat conductive sheet of the present disclosure constitute the matrix resin of the heat conductive sheet and also function as a binder for binding the particulate carbon material in the heat conductive sheet.

Flame retardant resins are not particular limited. For example, it is possible to use a flame retardant resin that is liquid at ordinary temperature and ordinary pressure and a flame retardant resin that is solid at ordinary temperature and ordinary pressure. These flame retardant resins may be used singly or in combination of two or more kinds. In the heat conductive sheet of the present disclosure, it is preferred to use a combination of a flame retardant resin that is solid at ordinary temperature and ordinary pressure and a flame retardant resin that is liquid at ordinary temperature and ordinary pressure. When the combination of a flame retardant resin that is solid at ordinary temperature and ordinary pressure and a flame retardant resin that is liquid at ordinary temperature and ordinary pressure is used as flame retardant resins, the solid flame retardant resin and the liquid flame retardant resin coexist in the heat conductive sheet under room temperature environment (i.e., at ordinary temperature and ordinary pressure) at the time of attachment and replacement of the heat conductive sheet, so that the balance between hardness and tackiness can be improved to thereby improve the handleability of the heat conductive sheet. Further, in a high temperature environment upon use of the heat conductive sheet (upon heat dissipating), the adhesion at the interface between the heat conductive sheet and adherends (e.g., heat radiator and heat source) can be enhanced to decrease the interfacial thermal resistance to further increase the heat conductivity of the heat conductive sheet.

When the proportion of the flame retardant resin that is liquid at ordinary temperature and ordinary pressure is high among the flame retardant resins contained in the heat conductive sheet, the flexibility of the heat conductive sheet increases and thus the adhesion at the interface between the heat conductive sheet and adherends (e.g., heat radiator and heat source) increases, so that the interfacial thermal resistance decreases and thus the heat conductivity of the heat conductive sheet may increase. In this case, however, the strength of the heat conductive sheet decreases and thus the handleability of the heat conductive sheet may become worse. On the other hand, when the proportion of the flame retardant resin that is solid at ordinary temperature and ordinary pressure becomes high, the strength of the heat conductive sheet increases and thus the handleability of the heat conductive sheet may increase. In this case, however, because the flexibility of the heat conductive sheet decreases, the adhesion at the interface between the heat conductive sheet and adherends (e.g., heat radiator and heat source) becomes worse, so that the interfacial thermal resistance increases and thus the heat conductivity of the heat conductive sheet may decrease. For the reasons above, in order to provide a good balance between flexibility and strength of the heat conductive sheet, among the flame retardant resins contained in the heat conductive sheet, the ratio of the flame retardant resin that is solid at ordinary temperature and ordinary pressure to the flame retardant resin that is liquid at ordinary temperature and ordinary pressure can be arbitrarily adjusted.

In the flame retardant resin contained in the heat conductive sheet, the ratio by mass of the flame retardant resin that is solid at ordinary temperature and ordinary pressure to the flame retardant resin that is liquid at ordinary temperature and ordinary pressure (solid/liquid ratio) is preferably 1/9 or more, more preferably 1/4 or more, and even more preferably 1/3 or more, but preferably 4/1 or less, more preferably 7/3 or less, and even more preferably 3/2 or less. When the ratio by mass of the flame retardant resin that is solid at ordinary temperature and ordinary pressure to the flame retardant resin that is liquid at ordinary temperature and ordinary pressure (solid/liquid ratio) is 1/9 or more, it is possible to further improve the handleability of the heat conductive sheet by increasing the strength of the heat conductive sheet. On the other hand, when the ratio by mass of the flame retardant resin that is solid at ordinary temperature and ordinary pressure to the flame retardant resin that is liquid at ordinary temperature and ordinary pressure (solid/liquid ratio) is 4/1 or less, it is possible to further increase the heat conductivity of the heat conductive sheet by increasing the flexibility of the heat conductive sheet.

Examples of usable flame retardant resins that meet the properties described above include vinyl chloride resins, fluororesins, silicone resins and other known flame retardant resins. These flame retardant resins may be used singly or in combination of two or kinds. As such flame retardant resins, it is preferred to use fluororesins or silicone resins, with fluororesins being more preferred. When fluororesins or silicone resins are used as the flame retardant resins, it is possible to further increase the flame retardancy of the heat conductive sheet.

<<Fluororesins>>

As fluororesins, it is possible to use, for example, fluororesins that are liquid at ordinary temperature and ordinary pressure and fluororesins that are solid at ordinary temperature and ordinary pressure.

In general, also for their excellent flame retardancy as well as excellent thermal resistance, oil resistance, chemical resistance and other properties, fluorine resins are preferred as the material constituting the matrix resin of the heat conductive sheet.

[Fluororesins that are Liquid at Ordinary Temperature and Ordinary Pressure]

Examples of fluororesins that are liquid at ordinary temperature and ordinary pressure include thermoplastic fluororesins that are liquid at ordinary temperature and ordinary pressure, such as vinylidene fluoride-hexafluoropropylene copolymers, vinylidene fluoride-hexafluoropentene-tetrafluoroethylene terpolymers, perfluoropropene oxide polymers, and tetrafluoroethylene-propylene-vinylidene fluoride copolymers.

Examples of commercially available thermoplastic fluororesins that are liquid at ordinary temperature and ordinary pressure include Viton® LM (Vition is a registered trademark in Japan, other countries, or both) manufactured by DuPont Co., Ltd., DAI-EL® G-101 (DAI-EL is a registered trademark in Japan, other countries, or both) manufactured by Daikin Industries, Ltd., DINION® FC 2210 (DINION is a registered trademark in Japan, other countries, or both) manufactured by 3M Japan Co., Ltd., and SIFEL Series manufactured by Shin-Etsu Chemical Co., Ltd.

[Fluororesins that are Solid at Ordinary Temperature and Ordinary Pressure]

Examples of fluororesins that are solid at ordinary temperature and ordinary pressure include elastomers obtained by polymerizing fluorine-containing monomers, such as vinylidene fluoride-based fluororesins, tetrafluoroethylene-propylene-based fluororesins, and tetrafluoroethylene-perfluorovinyl ether-based fluororesins. More specific examples include thermoplastic fluororesins that are solid at ordinary temperature and ordinary pressure, such as polytetrafluoroethylene, tetrafluoroethylene-perfluoroalkyl vinyl ether copolymers, tetrafluoroethylene-hexafluoropropylene copolymers, tetrafluoroethylene-ethylene copolymers, polyvinylidene fluoride, vinylidene fluoride-hexafluoropropylene copolymers, vinylidene fluoride-hexafluoropropylene-tetrafluoroethylene copolymers, polychlorotrifluoroethylene, ethylene-chlorofluoroethylene copolymers, tetrafluoroethylene-perfluorodioxole copolymers, polyvinyl fluoride, tetrafluoroethylene-propylene copolymers, acrylic-modified polytetrafluoroethylene, ester-modified polytetrafluoroethylene, epoxy-modified polytetrafluoroethylene, and silane-modified polytetrafluoroethylene. These thermoplastic fluororesins may be used singly or in combination of two or more kinds.

Elastomers herein are encompassed within the meaning of "resin."

Examples of commercially available thermoplastic fluororesins that are solid at ordinary temperature and ordinary pressure include DAI-EL® G-300 series (DAI-EL is a registered trademark in Japan, other countries, or both)/G-700 series/G-7000 series (polyol-vulcanized vinylidene fluoride-hexafluoropropylene binary copolymer), DAI-EL G-550 series/G-600 series (polyol-vulcanized vinylidene fluoride-hexafluoropropylene-tetrafluoroethylene terpolymer), DAI-EL G-800 series (peroxide vulcanized vinylidene fluoride-hexafluoropropylene binary copolymer), and DAI-EL G-900 series (peroxide vulcanized vinylidene fluoride-hexafluoropropylene-tetrafluoroethylene ternary copolymer), manufactured by Daikin Industries, Ltd.; KYNAR® series (KYNAR is a registered trademark in Japan, other countries, or both) (vinylidene fluoride-based fluororesin), and KYNAR FLEX® series (KYNAR FLEX is a registered trademark in Japan, other countries, or both) (vinylidene fluoride-hexafluoropropylene-tetrafluoroethylene terpolymer), manufactured by ALKEMA; A-100 (vinylidene fluoride-hexafluoropropylene binary copolymer) manufactured by KEMMERS; and DINION® FC2211 (DINION is a registered trademark in Japan, other countries, or both) (vinylidene fluoride-hexafluoropropylene binary copolymer), manufactured by 3M Japan Co., Ltd.

<<Silicone Resins>>

Silicone resins are not particularly limited and examples thereof include resins having an organopolysiloxane structure as the main chain. As such silicone resins, it is possible to use, for example, silicone resins that are liquid at ordinary temperature and ordinary pressure, and silicone resins that are solid at ordinary temperature and ordinary pressure.

[Silicone Resins that are Liquid at Ordinary Temperature and Ordinary Pressure]

As silicone resins that are liquid at ordinary temperature and ordinary pressure, it is possible to use silicone oils known in the art. Examples of usable silicone oils include straight silicone oils such as dimethyl silicone oil, methyl hydrogen silicone oil, and methyl phenyl silicone oil; and modified silicone oils such as amino-modified silicone oil, epoxy-modified silicone oil, carboxyl-modified silicone oil, carbinol-modified silicone oil, methacryl-modified silicone oil, mercapto-modified silicone oil, phenol-modified silicone oil, polyether-modified silicone oil, methylstyryl-modified silicone oil, alkyl-modified silicone oil, higher fatty acid ester-modified silicone oil, higher fatty acid amide-modified silicone oil, and fluorine-modified silicone oil.

These silicone oils may be used singly or in combination or two or more kinds. Silicone oils herein are encompassed within the meaning of "silicone resin."

[Silicone Resins that are Solid at Ordinary Temperature and Ordinary Pressure]

As silicone resins that are solid at ordinary temperature and ordinary pressure, it is possible to use, for example, one-part reactive silicone resins, two-part reactive silicone resins, three-part reactive silicone resins, and four or more part-reactive silicone resins. Among them, two-part reactive silicone resins may be suitably used because two-part reactive silicone resins are superior in storability to one-part reactive silicone resins and because two-part reactive silicone resins are superior in handleability to three or more part-reactive silicone resins. Two-part reactive silicone resins may be a mixture of a main agent and a curing agent. Two-part reactive silicone resins may be either two-part condensation reactive silicone resins or two-part addition reactive silicone resins. From the viewpoint of not generating a reaction by-product (outgas), it is preferred to use two-part addition reactive silicone resins.

For the preparation of a two-part addition reactive silicone resin, usually, an organopolysiloxane having an alkenyl group is used as a main agent and an organohydrogenpolysiloxane having an SiH group as a cross-linking group is used as a curing agent. The two liquids are mixed to effect an addition reaction (hydrosilylation reaction) in the presence of a metal catalyst such as platinum to afford a silicone resin (silicone gel), a reaction product of the main agent and the curing agent, which is usually a gel. The metal catalyst may be contained in the main agent or the curing agent, or may be added separately from the main agent and the curing agent.

Organopolysiloxanes that serve as the main agent are not particularly limited as long as they have an alkenyl group in the molecule. Examples of alkenyl groups the organopolysiloxanes have include vinyl group, butenyl group, pentenyl group, hexenyl group, and heptenyl group. Among them, the organopolysiloxanes preferably have a vinyl group. The structure of the organopolysiloxanes is generally linear having a repetition of diorganosiloxane units as the main chain, but may be partially branched.

Examples of organic groups other than alkenyl groups to be bound to the silicon atoms of organopolysiloxanes that serve as the main agent include alkyl groups such as methyl group, ethyl group, propyl group, butyl group, pentyl group, hexyl group, isopropyl group, isobutyl group, tert-butyl group, and cyclohexyl group; aryl groups such as phenyl group, tolyl group, and xylyl group; and halogenated alkyl groups such as 3-chloropropyl group and 3,3,3-trifluoropropyl group. Among them, organopolysiloxanes preferably have a methyl group. Examples of methyl group-containing polyorganosiloxanes which are easily available include dimethylpolysiloxane.

Organohydrogenpolysiloxanes that serve as the curing agent are not particularly limited as long they have a SiH group in the molecule. The structure of the organohydrogenpolysiloxanes may be, for example, linear, branched or cyclic. Examples of organic groups to be bound to the silicon atoms of the organohydrogenpolysiloxanes that serve as the curing agent are the same as those described above for the organopolysiloxanes that serve as the main agent.

Two-part condensation reactive silicone resins are usually room temperature vulcanizable (RTV) silicone resins that cure at room temperature. On the other hand, two-part addition reactive silicone resins are of two types: room temperature vulcanizable (RTV) silicone resins and low temperature vulcanizable (LTV) silicone resins which cure when heated to 50° C. or higher and 130° C. or lower, and both types may be used.

<<Amount of Flame Retardant Resin>>

The amount of the flame retardant resin in the heat conductive sheet is not particularly limited and is, for example, preferably 30% by mass or more, and more preferably 40% by mass or more, but preferably 70% by mass or less, and more preferably 65 mass % or less. When the amount of the flame retardant resin is not less than the lower limit described above, a highly flexible heat conductive sheet is favorably formed, and the heat conductivity of the heat conductive sheet can be further increased for example because the heat conductive sheet can be brought in close contact with an adherend. In addition, when the amount of the flame retardant resin is not less than the lower limit described above, the flame retardancy of the heat conductive sheet may be further increased. On the other hand, when the amount of the flame retardant resin is not greater than the upper limit described above, a sufficient amount of a particulate carbon material (later described) can be contained in the heat conductive sheet, whereby the heat conductivity and flame retardancy of the heat conductive sheet can be sufficiently increased.

<Particulate Carbon Material>

The particulate carbon material contained in the heat conductive sheet of the present disclosure has a particle size distribution in which the frequency of particles having a particle diameter of 30 µm or more and 150 µm or less is 20% or more.

In general, when a flame is brought in contact with a heat conductive sheet for the purpose of testing its flame retardancy, the flame decomposes the components (e.g., resin component) of the heat conductive sheet and/or collapses the structure of the components, causing the particulate carbon material contained in the heat conductive sheet to easily fall (i.e., droplets easily form). A presumed mechanism of this is that because the particulate carbon material contains air, the cohesive force between fillers (particulate carbon materials) in the heat conductive sheet is lost as a result of the air, contained in the particulate carbon material, expanding when the heat conductive sheet has been brought in contact with a flame. Particularly when the heat conductive sheet is made thin, the problem of falling of the particulate carbon material by contact with flame becomes remarkable, resulting in the heat conductive sheet having reduced flame retardancy. On the other hand, from the viewpoint of enhancing the heat conductivity of the heat conductive sheet, it is desirable to make the heat conductive sheet thinner. Thus, it has been difficult to reduce the thickness of the heat conductive sheet for increased heat conductivity while ensuring that the heat conductive sheet has a sufficiently high level of flame retardancy. In contrast, the heat conductive sheet of the present disclosure which comprises a flame retardant resin and a particulate carbon material having the specific particle size distribution described above and which contains an amount of the particulate carbon material that fall within a specific range does not easily generate droplets upon contact with a flame in spite of the fact that the heat conductive sheet is a relative thin sheet having a thickness of 50 µm or more and 120 µm or less. As a consequence, it is possible to increase the heat conductivity of the heat conductive sheet by reducing its thickness while ensuring a sufficiently high level of flame retardancy of the heat conductive sheet. A presumed mechanism of this is as follows: the particulate carbon material having the specific particle size distribution contained in the heat conductive sheet of the present disclosure has a relatively small particle diameter and hence contains lower volumes of air therein. Thus, the expansion of the air when the heat conductive sheet is brought in contact with a flame is small and thus the cohesion between fillers (particulate carbon materials) in the heat conductive sheet is not easily lost.

In the particle size distribution of the particulate carbon material contained in the heat conductive sheet of the present disclosure, the frequency of particles having a particle diameter of 30 µm or more and 150 µm or less is preferably 30% or more, and more preferably 40% or more. When the frequency of particles having a particle diameter that falls within the range described above is not less than the specific value described above, it is possible to further favorably achieve excellent flame retardancy and heat conductivity at the same time in the heat conductive sheet.

The particulate carbon material used for producing the heat conductive sheet of the present disclosure is used after being optionally disintegrated in order for the particulate carbon material to have the specific particle size distribution described above. Methods of disintegrating the particulate carbon material are not particularly limited and the particulate carbon material can be disintegrated using any disintegrating machine or crushing machine known in the art. The disintegrating conditions can be appropriately adjusted to an extent that a desired effect is obtained.

The above-described disintegrating treatment may be carried out only on the particulate carbon material alone or may be carried out on a composition which comprises the particulate carbon material, the flame retardant resin, and other components.

Particulate carbon materials are not particularly limited and examples thereof include graphites such as artificial graphite, scaly graphite, exfoliated graphite, natural graphite, acid-treated graphite, expandable graphite, and expanded graphite; and carbon black. These particulate carbon materials can be used singly or in combination of two or more kinds.

Preferred particulate carbon materials are expanded graphite. The use of expanded graphite can further improve the heat conductivity of the heat conductive sheet.

<<Expanded Graphite>>

Expanded graphite that can be suitably used as the particulate carbon material is obtained for example by expanding expandable graphite, which has been obtained by chemically treating graphite such as scaly graphite with sulfuric acid or the like, by heat treatment and then micronizing the obtained expanded graphite. Examples of expanded graphites include those available under the tradenames EC1500, EC1000, EC500, EC300, EC100, and EC 50, manufactured by Ito Graphite Co., Ltd. These commercially available expanded graphites can be used singly or as a mixture as long as they have the specific particle size distribution described above in the heat conductive sheet produced.

<<Properties of Particulate Carbon Material>>

The volume-average particle diameter of the particulate carbon material contained in the heat conductive sheet of the present disclosure is preferably 20 μm or more, more preferably 30 μm or more, and even more preferably 40 μm or more, but preferably 180 μm or less, more preferably 140 μm or less, and even more preferably 100 μm or less. When the volume-average particle diameter of the particulate carbon material is not less than the lower limit described above, it is possible to further increase the heat conductivity of the heat conductive sheet. Further, when the volume-average particle diameter of the particulate carbon material is not greater than the upper limit described above, it is possible to further increase the flame retardancy of the heat conductive sheet.

The aspect ratio (long diameter/short diameter) of the particulate carbon material contained in the heat conductive sheet of the present disclosure is preferably 1 or more, and more preferably 1.5 or more, but preferably 10 or less, more preferably 5 or less, and even more preferably 3 or less.

In particular, it is preferred that the particulate carbon material is not spherical particles from the viewpoint that the particulate carbon material can be favorably oriented within the heat conductive sheet when used as a filler of the heat conductive sheet.

The "aspect ratio" herein can be obtained by observing a cross section in the thickness direction of the heat conductive sheet by scanning electron microscopy (SEM), measuring maximum diameters (long diameters) and particle diameters in the direction perpendicular to the maximum diameter (short diameters) for 50 particulate carbon materials arbitrarily selected, and calculating the average of the ratios of long diameter to short diameter (long diameter/short diameter).

<<Amount of Particulate Carbon Material>>

The amount of the particulate carbon material in the heat conductive sheet of the present disclosure needs to be 30% by mass or more and is preferably 35% by mass or more, and more preferably 40% by mass or more, but preferably 55% by mass or less, more preferably 53% by mass or less, and even more preferably 50% by mass or less. When the amount of the particulate carbon material in the heat conductive sheet is not less than the lower limit described above, it is possible to sufficiently increase the flame retardancy of the heat conductive sheet. When the amount of the particulate carbon material in the heat conductive sheet is not greater than the upper limit described above, it is possible to improve the adhesion between pre-heat conductive sheets (later described) upon lamination by allowing a sufficient amount of the flame retardant resin to be contained in the sheet, whereby the self-supporting property of the resulting heat conductive sheet can be sufficiently ensured and also the adhesion at the interface between the heat conductive sheet and adherends (e.g., heat radiator and heat source) is enhanced, thus reducing the interfacial thermal resistance and further increasing the heat conductivity of the heat conductive sheet.

<Additives>

The heat conductive sheet can be optionally blended with known additives that may be used to form heat conductive sheets. Additives to be blended into the heat conductive sheet are not particularly limited and examples thereof include adhesive resins; flame retardants such as red phosphorus-based flame retardants and phosphate-based flame retardants; plasticizers; moisture absorbents such as calcium oxide and magnesium oxide; adhesiveness improvers such as silane coupling agents, titanium coupling agents, and acid anhydrides; wettability improvers such as nonionic surfactants and fluorine-based surfactants; ion trap agents such as inorganic ion exchangers; and fibrous carbon materials such as carbon nanotubes, vapor grown carbon fibers, carbon fibers obtained by carbonization of organic fibers, chopped products thereof.

Because the heat conductive sheet of the present disclosure comprises at least a flame retardant resin and a particulate carbon material having the specific particle size distribution described above and contains an amount of the particulate carbon material that fall within the specific range, the heat conductive sheet can exert excellent flame retardancy even when, for example, flame retardants such as those described above are not blended.

<Method of Forming Heat Conductive Sheet>

Methods of forming the heat conductive sheet of the present disclosure are not particularly limited as long as the resulting heat conductive sheet comprises a flame retardant resin and a particulate carbon material having the specific particle size distribution described above and the amount of the particulate carbon material and the thickness of the heat conductive sheet fall within the respective specific ranges. The heat conductive sheet can be formed for example through a pre-heat conductive sheet forming step, a laminate forming step, a slicing step, and the like.

<<Pre-Heat Conductive Sheet Forming Step>>

In the pre-heat conductive sheet forming step, a composition which comprises a flame retardant resin and a specific amount of a particulate carbon material having the specific particle size distribution described above and which optionally further comprises an additive is shaped into a sheet by pressure application to provide a pre-heat conductive sheet.

[Composition]

The composition can be prepared by mixing a flame retardant resin, a particulate carbon material, and the optional component (additive) described above. As such a flame retardant resin, a particulate carbon material and an optional additive, those described above which can be contained in the heat conductive sheet of the present disclosure can be used. The amount of each component in the composition can also be appropriately changed within the range described above.

Mixing of the components described above can be effected by any means, e.g., using a mixing device known in the art, such as a kneader, a roll, or a mixer. Mixing may be effected in the presence of solvent such as organic solvent. The mixing time can be, for example, 5 minutes or more and 60 minutes or less. The temperature during mixing can be, for example, 5° C. or higher and 150° C. or lower.

[Shaping of Composition]

The composition prepared in the manner described above can then be shaped into a sheet by pressure application (primary pressurization), optionally after it has been degassed and disintegrated.

Any method can be used for shaping of the composition as long as pressure is applied thereto. The composition can be shaped into a sheet by shaping methods known in the art, such as rolling or extruding. In particular, it is preferred that the composition is shaped into a sheet by rolling, more preferably by passing the composition between rolls with the composition sandwiched between protection films. Any protection film can be used, e.g., sandblasted polyethylene terephthalte (PET) films can be used. Roll temperature can be set to 5° C. or higher and 150° C. or lower.

[Pre-Heat Conductive Sheet]

It is presumed that in the pre-heat conductive sheet obtaining by shaping a composition into a sheet by pressure application, the particulate carbon materials are aligned mainly in the in-plane direction, whereby the heat conductivity of surface direction improves particularly in the in-plane direction.

The thickness of the pre-heat conductive sheet is not particularly limited, and can be, for example, 0.05 mm or more and 2 mm or less.

<<Laminate Forming Step>>

In the laminate forming step, a laminate is obtained either by laminating on top of each other pre-heat conductive sheets obtained in the pre-heat conductive sheet forming step, or by folding or rolling the pre-heat conductive sheet.

When it is desired to sufficiently limit the delamination of the laminate obtained in the laminate forming step by further increasing the adhesive force between surfaces of the pre-heat conductive sheet(s), the laminate forming step may be carried out with the surface of the pre-heat conductive sheet being slightly dissolved with a solvent, the laminate forming step may be carried out with an adhesive being applied on the surface of the pre-heat conductive sheet or with an adhesive layer being disposed on the surface of the pre-heat conductive sheet, or the laminate of the pre-heat conductive sheet(s) may be further pressed in the laminating direction (secondary pressurization).

From the viewpoint of efficiently limiting delamination, it is preferred to subject the obtained laminate to secondary pressurization in the lamination direction. The conditions for secondary pressurization are not particularly limited; the pressure in the lamination direction can be 0.05 MPa or more and 0.5 MPa or less, the temperature can be 80° C. or higher and 170° C. or lower, and the pressurization time can be 10 seconds or more and 30 minutes or less.

In the laminate obtained by lamination, folding or rolling of pre-heat conductive sheet(s), it is presumed that the particulate carbon materials are aligned in a direction substantially perpendicular to the lamination direction.

<<Slicing Step>>

In the slicing step, the laminate obtained in the laminate forming step is sliced at an angle of 45° or less relative to the lamination direction to provide a heat conductive sheet formed of a sliced piece of the laminate.

Any method can be used to slice the laminate, e.g., multi-blade method, laser processing method, water jet method, or knife processing method can be used, with the knife processing method being preferred because the thickness of the heat conductive sheet can be easily made uniform. Cutting tools for slicing the laminate are not particularly limited. For example, such slicers can be used which have a fixture (e.g., a metal plate) for fixing the laminate by pressing it in the lamination direction and a slicing member having a double-edged cutting blade and which are configured to slice the laminate by moving the cutting blade with the laminate being pressed by means of the fixture.

From the viewpoint of further increasing the heat conductivity of the heat conductive sheet, the angle at which the laminate is sliced is preferably substantially 0° relative to the lamination direction (i.e., along the lamination direction).

From the viewpoint of increasing the easiness of slicing, the temperature of the laminate at the time of slicing is preferably −20° C. or higher and 30° C. or lower. For the same reason, the laminate is preferably sliced while applying a pressure in the lamination direction, and more preferably while applying a pressure of 0.05 MPa or more and 0.5 MPa or less in the lamination direction.

It is presumed that in the heat conductive sheet obtained by slicing the laminate, the particulate carbon materials are aligned in a direction substantially perpendicular to the in-plane direction (i.e., aligned in the thickness direction of the heat conductive sheet) and thereby the heat conductivity in thickness direction of the heat conductive sheet particularly increases.

<Properties of Heat Conductive Sheet>

<<Thickness>>

The thickness of the heat conductive sheet of the present disclosure needs to be 120 μm or less and is preferably 115 μm or less, and more preferably 110 μm or less, but needs to be 50 μm or more and is preferably 70 μm or more, and more preferably 80 μm or more. When the thickness of the heat conductive sheet having the specific components and specific configuration described above is not greater than the upper limit described above, it is possible to sufficiently increase the heat conductivity of the heat conductive sheet. When the thickness of the heat conductive sheet is not less than the lower limit described above, it is possible to ensure flame retardancy, strength and handleability of the heat conductive sheet without excessively thinning the heat conductive sheet.

As described above, usually, as the thickness of a heat conductive sheet is reduced, structural collapse etc. of the heat conductive sheet caused by contact with flame more easily progress. In contrast, because the heat conductive sheet of the present disclosure comprises at least a flame retardant resin and a particulate carbon material having the specific particle size distribution described above and contains an amount of the particulate carbon material that fall within the specific range, it is possible to limit the generation of droplets caused by contact with flame even when the heat conductive sheet has been thinned to a thickness that is not greater than the upper limit described above.

<<Thermal Resistance Value>>

The heat conductive sheet of the present disclosure preferably has a thermal resistance value under 0.1 MPa pressure of 0.18° C./W or less, more preferably 0.17° C./W or less, and even more preferably 0.16° C./W or less. When the thermal resistance value under 0.1 MPa pressure is not greater than the upper limit described above, the heat conductive sheet can exhibit excellent heat conductivity.

EXAMPLES

The following provides a more specific description of the present disclosure based on Examples, which however shall not be construed as limiting. In the following description, "%" and "parts" used to express quantities are by mass, unless otherwise specified.

In Examples and Comparative Examples, the particle size distribution and volume-average particle diameter of the particulate carbon material in the heat conductive sheet, and the thickness, thermal resistance value and flame retardancy of the heat conductive sheet were measured or evaluated in accordance with the methods described below.

<Particle Size Distribution and Volume-Average Particle Diameter>

1 g of a heat conductive sheet was placed in methyl ethyl ketone as a solvent to dissolve resin and other components of the heat conductive sheet. In this way a suspension was obtained in which particles of particulate carbon material (expanded graphite) contained in the heat conductive sheet were separated and dispersed. Next, the particle diameters of the particulate carbon material contained in the suspension were measured using a laser diffraction/scattering particle size analyzer (Model LA-960, HORIBA Scientific). A particle size distribution curve with the obtained particle diameter placed on the horizontal axis and the frequency of particles converted into volume placed on the vertical axis was prepared.

From the obtained particle size distribution curve, the frequency of particles having a particle diameter of 30 μm or more and 150 μm or less in the particle size distribution of the particulate carbon material contained in the heat conductive sheet was determined.

Further, in the particle size distribution curve, the particle diameter (D50) at which the cumulative volume calculated from the fine side becomes 50% was determined and taken as the value of the volume-average particle diameter of the particulate carbon material.

<Thickness>

The thickness of the heat conductive sheet was measured using a film thickness meter (Digimatic indicator ID-C112XBS, manufactured by Mitutoyo Corporation). The average (μm) of values measured at 5 arbitrary points at the heat conductive sheet surface was taken as the thickness of the heat conductive sheet.

<Thermal Resistance Value>

The thermal resistance value of the heat conductive sheet was measured using a thermal resistance tester (resin material thermal resistance measuring instrument, manufactured by Hitachi Technology & Service, Ltd.). A heat conductive sheet cut into a substantially 1 cm×1 cm square was used as a sample. Thermal resistance (° C./W) of the sample at the time when a pressure of 0.1 MPa was applied at a sample temperature of 50° C. was measured. A smaller thermal resistance value indicates a better heat conductivity of the heat conductive sheet and, for example, better heat dissipation characteristics when the heat conductive sheet is interposed between a heat source and a heat radiator.

<Flame Retardancy>

10 specimens were prepared by cutting the heat conductive sheet into a size of 125 mm long×13 mm wide. 5 of the specimens were subjected to 48 hours storage in an environment of 23° C. and 50% relative humidity (treatment I). The other 5 specimens were subjected to aging treatment by storing them for 168 hours in an environment of 70° C. (treatment II). In this way two sets of 5 specimens were prepared, with each set subjected to a different treatment.

Next, the specimens of each set were vertically lifted one by one and supported by a fixing clamp, and absorbent cotton was placed about 300 mm under the supported specimens. A blue flame with a height of about 20 mm was made by adjusting the flow rates of air and gas of a Bunsen burner and the Bunsen burner flame was applied to the lower end of the vertically supported specimen (such that approximately 10 mm part of the specimen was placed in the flame). After keeping this state for 10 seconds, the Bunsen burner flame was separated from the specimen. If the flame on the specimen went out, the Bunsen burner flame was immediately applied again to the specimen, and after keeping this state for another 10 seconds, the Bunsen burner flame was separated from the specimen. Remaining flame time (time where the specimen burns with flame) after the first contact with flame, remaining flame time after the second contact with flame, flameless burning time (time where the specimen burns without flame after removing the burner flame) after the second contact with flame, whether or not the specimen burned to the position of the fixation clamp, whether or not the specimen set the absorbent cotton on fire, and whether or not the specimen burned with flame and produced droplets were checked and evaluated in accordance with the UL94 standard V test (vertical combustion test).

Specifically, it was determined whether the two sets of 5 specimens satisfy the following 5 conditions: (1) remaining flame time was within 10 seconds both after the first contact and second contact with flame; (2) total remaining flame time after contact with flame for 5 specimens was within 50 seconds; (3) no specimen burned with or without flame to the position of the fixation clamp; (4) droplets that set the absorbent cotton on fire were not produced; and (5) flameless burning time after the second contact with flame was within 30 seconds. When the conditions described above were satisfied, it was determined that V-0 grade was satisfied. It can be said that a heat conductive sheet whose specimens subjected to 48 hours storage (treatment I) and aging treatment (treatment II) all satisfied V-0 grade is excellent in flame retardancy.

V-0: V-0 grade is satisfied

Out of specification: V-0 grade is not satisfied

Example 1

<Preparation of Composition>

70 parts of a thermoplastic fluororesin that is liquid at ordinary temperature and ordinary pressure (DAI-EL® G-101, manufactured by Daikin Industries) and 30 parts of a thermoplastic fluororesin that is solid at ordinary temperature and ordinary pressure (DINION® FC 2211, manufactured by 3M Japan Co., Ltd) as flame retardant resins; and 90 parts of expanded graphite (EC 300, manufactured by Ito Graphite Co., Ltd., volume-average particle diameter=50 μm) as a particulate carbon material were mixed under stirring at a temperature of 150° C. for 20 minutes using a pressure kneader (manufactured by Nippon Spindle Co., Ltd.). The mixture obtained was introduced into a disintegrating machine (Wonder Crush Mill D3V-10, manufactured by Osaka Chemical Co., Ltd.) and disintegrated for 10 seconds to afford a composition.

<Formation of Pre-Heat Conductive Sheet>

Next, 50 g of the composition obtained was sandwiched with 50 μm thick sandblasted PET films (protection films) and rolled (for primary pressurization) under the following conditions: roll-to-roll gap=550 μm, roll temperature=50° C., roll linear pressure=50 kg/cm, and roll speed=1 m/min. In this way a pre-heat conductive sheet having a thickness of 0.5 mm was obtained.

<Formation of Laminate>

Subsequently, the obtained pre-heat conductive sheet was cut into a size of 150 mm long×150 mm wide×0.5 mm thick and 120 sheets were laminated on top of one another in the thickness direction of the pre-heat conductive sheet and further pressed (for secondary pressurization) in the laminating direction at 120° C. and a pressure of 0.1 MPa for 3 minutes. In this way a laminate having a height of about 60 mm was obtained.

<Formation of Heat Conductive Sheet>

Subsequently, leaving the length necessary for slicing, the entire top surface of the resulting laminate was pressed with a metal plate, and a pressure of 0.1 MPa was applied in the lamination direction (i.e., from the above) to fix the laminate. Note that the side surfaces and back surface of the laminate were not fixed. At this time, the temperature of the laminate was 25° C.

Next, a cutting blade 10 having the shape shown in the Figure (double-edged, blade angle=20°, maximum thickness of the blade portion=3.5 mm, material=super steel, Rockwell hardness=91.5, no silicone processing on the blade surface, total length=200 mm) was attached to the press part of a servo press machine (manufactured by Hoden Seimitsu Kenkyusho Co., Ltd.). The laminate was then sliced in the lamination direction (in other words, in the direction coincident with the normal to the main surface of the laminated pre-heat conductive sheets) under the conditions of a slicing speed of 200 mm/sec and a slicing width of 100 μm. In this way a heat conductive sheet 30 with dimensions of 150 mm long×60 mm wide×0.10 mm thick was obtained. The orientation of the cutting blade at the time of slicing was such that the angle c shown in the Figure was 10° and the extending direction of a blade surface 11 was parallel to a slice surface 21 of a laminate 20.

The thermal resistance value and flame retardancy were measured for the obtained heat conductive sheet in accordance with the methods described above. The particle size distribution and volume-average particle diameter of the particulate carbon material in the obtained heat conductive sheet were also measured in accordance with the methods described above. The results are shown in Table 1.

Example 2

A composition, a pre-heat conductive sheet, a laminate and a heat conductive sheet were produced as in Example 1 except that upon preparation of the composition, the amount of expanded graphite (EC 300, manufactured by Ito Graphite Co., Ltd., volume-average particle diameter=50 m) as a particulate carbon material was changed to 110 parts.

Measurements were then made as in Example 1. The results are shown in Table 1.

Example 3

A composition, a pre-heat conductive sheet, a laminate and a heat conductive sheet were produced as in Example 1 except that upon preparation of the composition, 90 parts of expanded graphite having a smaller volume-average particle diameter (EC 500, manufactured by Ito Graphite Co., Ltd., volume-average particle diameter=25 μm) was used as a particulate carbon material.

Measurements were then made as in Example 1. The results are shown in Table 1.

Example 4

A composition, a pre-heat conductive sheet, a laminate and a heat conductive sheet were produced as in Example 1 except that upon preparation of the composition, the amount of expanded graphite (EC 300, manufactured by Ito Graphite Co., Ltd., volume-average particle diameter=50 m) as a particulate carbon material was changed to 120 parts.

Measurements were then made as in Example 1. The results are shown in Table 1.

Example 5

A composition, a pre-heat conductive sheet, a laminate and a heat conductive sheet were produced as in Example 1 except that upon preparation of the composition, the amount of expanded graphite (EC 300, manufactured by Ito Graphite Co., Ltd., volume-average particle diameter=50 m) as a particulate carbon material was changed to 50 parts.

Measurements were then made as in Example 1. The results are shown in Table 1.

Example 6

A composition, a pre-heat conductive sheet, a laminate and a heat conductive sheet were produced as in Example 1 except that upon preparation of the composition, 70 parts of expanded graphite (EC 300, manufactured by Ito Graphite Co., Ltd., volume-average particle diameter=50 μm) and 20 parts of expanded graphite having a smaller volume-average particle diameter (EC 500, manufactured by Ito Graphite Co., Ltd., volume-average particle diameter=25 μm) were used in combination as particulate carbon materials. Measurements were then made as in Example 1. The results are shown in Table 1.

Comparative Example 1

<Preparation of Fibrous Carbon Nanostructures a Including CNTs>

In accordance with the teachings of WO2006/011655A1, fibrous carbon nanostructures A including carbon nanotubes obtained by the super growth method (hereinafter also referred to as "SGCNTs") were obtained.

The fibrous carbon nanostructures A obtained had a G/D ratio of 3.0, a BET specific surface area of 800 $m^2/g$, and a mass density of 0.03 $g/cm^3$. The diameters of 100 randomly-selected fibrous carbon nanostructures A were measured using a transmission electron microscope. As a result, the fibrous carbon nanostructures were found to have an average particle diameter (Av) of 3.3 nm, 3ρ (the sample standard deviation (ρ) of the diameters multiplied by 3) of 1.9 nm, a ratio of 3ρ to Av (3ρ/Av) of 0.58, and an average length of 100 μm. The fibrous carbon nanostructures A obtained were mainly composed of single-walled CNTs.

<Preparation of Easily Dispersible Aggregate of Fibrous Carbon Nanostructure A>
[Preparation of Dispersion]

400 mg of the fibrous carbon nanostructures A was weighed, mixed in 2 L of methyl ethyl ketone as a solvent, and stirred for 2 minutes with a homogenizer to afford a crude dispersion. Using a wet type jet mill (JN-20, manufactured by JOKOH CO., LTD.), the crude dispersion was passed through a 0.5 mm channel of the wet jet mill at a pressure of 100 MPa for two cycles for dispersing the carbon nanostructures A in methyl ethyl ketone. In this way a dispersion liquid A having a solid content concentration 0.20% by mass was obtained.

[Removal of Solvent]

The dispersion A obtained was then filtered under reduced pressure using Kiriyama filter paper (No. 5A) to afford a sheet of an easily dispersible aggregate.

<Preparation of Composition>

0.1 parts by mass of the easily dispersible aggregate of fibrous carbon nanostructures A as a fibrous carbon material; 85 parts of expanded graphite (EC-50, manufactured by Ito Graphite Co., Ltd., average particle diameter=greater than 250 μm) as a particulate carbon material; 40 parts by mass of a thermoplastic fluororubber that is solid at ordinary temperature and ordinary pressure (DAI-EL® G-704BP, manufactured by Daikin Industries) and 45 parts by mass a thermoplastic fluororubber that is liquid at ordinary temperature and ordinary pressure (DAI-EL® G-101, manufactured by Daikin Industries) as resins; and 5 parts by mass of sebacic acid ester as a plasticizer (DOS, manufactured by Daihachi Chemical Industry Co., Ltd.) were mixed under stirring for 5 minutes in the presence of 100 parts of ethyl acetate as a solvent using a Hobart mixer (Model ACM-5 LVT, manufactured by Kodaira Seisakusho Co., Ltd.). The mixture obtained was degassed in vacuum for 30 minutes and ethyl acetate was removed at the same time as degassing to afford a composition containing the fibrous carbon nanostructures A (SGCNTs) and expanded graphite. The composition was put into a disintegrating machine and disintegrated for 10 seconds.

A composition, a pre-heat conductive sheet, a laminate and a heat conductive sheet were then produced as in Example 1 except upon formation of the heat conductive sheet, the thickness of the slice was set to 250 μm.

Measurements were then made as in Example 1. The results are shown in Table 1.

Comparative Example 2

A composition, a pre-heat conductive sheet, a laminate and a heat conductive sheet were then produced as in Comparative Example 1 except upon formation of the heat conductive sheet, the thickness of the slice was set to 100 μm.

Measurements were then made as in Example 1. The results are shown in Table 1.

Comparative Example 3

A composition, a pre-heat conductive sheet, a laminate and a heat conductive sheet were produced as in Example 1 except that upon preparation of the composition, 90 parts of expanded graphite having a larger volume-average particle diameter (EC 100, manufactured by Ito Graphite Co., Ltd., volume-average particle diameter=170 to 230 μm) was used as a particulate carbon material.

Measurements were then made as in Example 1. The results are shown in Table 1.

Comparative Example 4

A composition, a pre-heat conductive sheet, a laminate and a heat conductive sheet were produced as in Example 1 except that upon preparation of the composition, 90 parts of expanded graphite having a much smaller volume-average particle diameter (EC 1500, manufactured by Ito Graphite Co., Ltd., volume-average particle diameter=7 μm) was used as a particulate carbon material.

Measurements were then made as in Example 1. The results are shown in Table 1.

Comparative Example 5

A composition, a pre-heat conductive sheet, a laminate and a heat conductive sheet were produced as in Example 1 except that upon preparation of the composition, the amount of expanded graphite (EC 300, manufactured by Ito Graphite Co., Ltd., volume-average particle diameter=50 m) as a particulate carbon material was changed to 40 parts.

Measurements were then made as in Example 1. The results are shown in Table 1.

TABLE 1

| Composition [parts by mass] | | Ex. 1 | Ex. 2 | Ex. 3 | Ex. 4 | Ex. 5 | Ex. 6 | Comp. Ex. 1 | Comp. Ex. 2 | Comp. Ex. 3 | Comp. Ex. 4 | Comp. Ex. 5 |
|---|---|---|---|---|---|---|---|---|---|---|---|---|
| Fluororesins | Liquid at ordinary temperature and ordinary pressure DAI-EL G-101 | 70 | 70 | 70 | 70 | 70 | 70 | 45 | 45 | 70 | 70 | 70 |
| | Solid at ordinary temperature and ordinary pressure DINIONFC-2211 DAI-EL G-704BP | 30 | 30 | 30 | 30 | 30 | 30 | — | — | 30 | 30 | 30 |
| Plasticizer | Sebacic acid ester | — | — | — | — | — | — | 40 | 40 | — | — | — |
| Fibrous carbon material | Fibrous carbon nanostructures A | — | — | — | — | — | — | 5 / 0.1 | 5 / 0.1 | — | — | — |
| Particulate carbon material | EC-50 (volume-average particle diameter >250 μm) | — | — | — | — | — | — | 85 | 85 | — | — | — |
| | EC-100 (volume-average particle diameter = 170 to 230 μm) | — | 110 | — | — | — | — | — | — | 90 | — | — |
| | EC-300 (volume-average particle diameter = 50 μm) | 90 | — | 90 | 120 | — | 70 | — | — | — | — | — |
| | EC-500 (volume-average particle diameter = 25 μm) | — | — | — | — | 50 | — | — | — | — | — | 40 |
| | EC-1500 (volume-average particle diameter = 7 μm) | — | — | — | — | — | 20 | — | — | — | 90 | — |
| Evaluations | Amount of particulate carbon material [% by mass] | 47.4 | 52.4 | 47.4 | 54.5 | 33.3 | 47.4 | 48.6 | 48.6 | 47.4 | 47.4 | 28.6 |
| | Volume-average particle diameter of particulate carbon material [μm] | 63 | 59 | 31 | 60 | 50 | 73 | 232 | 232 | 211 | 14 | 64 |
| | Frequency of particles having a particle diameter of 30 nm to 150 nm in a particle size distribution of particulate carbon material [%] | 54 | 54 | 24 | 54 | 54 | 58 | 5 | 5 | 15 | 3 | 54 |
| | Thickness of heat conductive sheet [μm] | 100 | 100 | 100 | 100 | 100 | 100 | 250 | 100 | 100 | 100 | 100 |
| | Flame retardancy | V-0 | V-0 | V-0 | V-0 | V-0 | V-0 | V-0 | Out of spec. | Out of spec. | V-0 | Out of spec. |
| | Thermal resistance [° C./W] (under 0.1 MPa pressure) | 0.124 | 0.138 | 0.151 | 0.162 | 0.139 | 0.142 | 0.2 | 0.14 | 0.17 | 0.36 | 0.17 |

It can be seen from Table 1 that the heat conductive sheets of Examples 1 to 6, which comprise a flame retardant resin and a particulate carbon material having the specific particle size distribution described above, contains an amount of the particulate carbon material that is equal to or higher than the above specific value, and have a thickness that falls within the specific range described above, can have excellent flame retardancy and excellent heat conductivity at the same time.

On the other hand, it can be seen that the heat conductive sheet of Comparative Example 1 whose thickness exceeds the specific range described above is inferior in heat conductivity even though high flame retardancy can be ensured.

It can be also seen that the heat conductive sheets of Comparative Examples 2 and 3, wherein the frequency of particles having a particle diameter falling within the specific range is below the specific value in a particle size distribution of the particulate carbon material because of a large average particle diameter of the particulate carbon material, are inferior in flame retardancy even though high heat conductivity can be ensured.

Further, it can be seen that the heat conductive sheet of Comparative Example 4, wherein the frequency of particles having a particle diameter falling within the specific range is below the specific value in a particle size distribution of the particulate carbon material because of a small average particle diameter of the particulate carbon material, is inferior in heat conductivity because the interfacial thermal resistance between the particulate carbon material and the flame retardant resin increases due to increased amounts of the particulate carbon material having a small particle diameter, even though high flame retardancy can be ensured.

Finally, it can be seen that the heat conductive sheet of Comparative Example 5, wherein the amount of the particulate carbon material is less than the specific value described above, is inferior in flame retardancy.

INDUSTRIAL APPLICABILITY

According to the present disclosure, it is possible to provide a heat conductive sheet which may have excellent flame retardancy and excellent heat conductivity at the same time.

REFERENCE SIGNS LIST

10 Cutting blade
11 Blade surface
20 Laminate
21 Slice surface
30 Heat conductive sheet

The invention claimed is:

1. A heat conductive sheet comprising a flame retardant resin and a particulate carbon material, wherein
    the particulate carbon material has a particle size distribution in which a frequency of particles having a particle diameter of 30 μm or more and 150 μm or less is 20% or more,
    an amount of the particulate carbon material in the heat conductive sheet is 30% by mass or more and 55% by mass or less, and
    a thickness of the heat conductive sheet is 50 μm or more and 120 μm or less.

2. The heat conductive sheet according to claim 1, wherein the flame retardant resin is a combination of a flame retardant resin that is solid at ordinary temperature and ordinary pressure and a flame retardant resin that is liquid at ordinary temperature and ordinary pressure.

3. The heat conductive sheet according to claim 1, wherein the flame retardant resin is a fluororesin or a silicone resin.

4. The heat conductive sheet according to claim 1, wherein the particulate carbon material is expanded graphite.

5. The heat conductive sheet according to claim 1, wherein a volume-average particle diameter of the particulate carbon material is 20 μm or more and 180 μm or less.

* * * * *